United States Patent
Schweighofer

[19]

[11] Patent Number: 6,160,445
[45] Date of Patent: Dec. 12, 2000

[54] POWER AMPLIFIER AND METHOD FOR THE DRIVE OF A POWER AMPLIFIER

[75] Inventor: Peter Schweighofer, Nuremberg, Germany

[73] Assignee: Siemens Aktiengesellschaft, Munich, Germany

[21] Appl. No.: 09/324,822

[22] Filed: Jun. 2, 1999

[30] Foreign Application Priority Data

Jun. 3, 1998 [DE] Germany ............................ 198 24 768

[51] Int. Cl.$^7$ ....................................................... H03F 3/38
[52] U.S. Cl. .................................................. 330/10; 330/59
[58] Field of Search ................................. 330/10, 207 A, 330/251, 59; 375/238

[56] References Cited

U.S. PATENT DOCUMENTS

| | | | |
|---|---|---|---|
| 5,111,378 | 5/1992 | Nowak et al. | 363/98 |
| 5,381,109 | 1/1995 | Cripe et al. | 330/10 |
| 5,436,592 | 7/1995 | Schlegl | 330/10 |
| 5,546,299 | 8/1996 | Lenz | 363/71 |
| 5,600,634 | 2/1997 | Satoh et al. | 370/294 |
| 6,031,422 | 2/2000 | Ideler | 330/10 |
| 6,034,565 | 3/2000 | Schweighofer | 330/10 |

FOREIGN PATENT DOCUMENTS 0 349 732   1/1990   European Pat. Off. .

*Primary Examiner*—Steven J. Mottola
*Attorney, Agent, or Firm*—Schiff Hardin & Waite

[57] ABSTRACT

A power amplifier having at least one switched output stage and a control unit for determining drive data for the at least one switched output stage, the control unit including an encoder for encoding the drive data in order to generate a data signal (DAT) according to a serial data transmission protocol, a data transmission link is provided for the transmission of the data signal, and a modulator is provided for generating switching signals for the switched output stage or stages dependent on the data signal. The structural outlay for the power amplifier thus is reduced, particularly in the case of a power amplifier having a number of output stages.

12 Claims, 1 Drawing Sheet

POWER AMPLIFIER AND METHOD FOR THE DRIVE OF A POWER AMPLIFIER

BACKGROUND OF THE INVENTION

1. Field of the Invention

The present invention is directed to a power amplifier of the type having at least one switched output stage, a control unit which determines drive data for the output stage and for generating a data signal embodying the drive data, and a modulator, supplied with the drive data, which generates switching signals for the output stage dependent on the drive data. The power amplifier of the invention is particularly suited for use as a gradient amplifier of a magnetic resonance tomography apparatus.

2. Description of the Prior Art

German OS 38 22 990 discloses a number of embodiments of a power amplifier, particularly for the low-frequency and audio frequency range. In one of these embodiments the power amplifier includes a control circuit to which a number of switched output stages are each connected via respective control line. The control circuit in turn contains a pre-modulator that is connected by first transmission lines to a corresponding number of pulse duration modulators. The pulse duration modulators are connected to a common reference oscillator stage via second transmission lines and are connected to the switched output stages via the control lines.

In the specific use of a power amplifier in a magnetic resonance tomography apparatus, a magnetic field gradient is generated by a gradient coil that is connected to a gradient amplifier. The gradient amplifier delivers voltages on the order of magnitude from a few hundred up to a few thousand volts in order to produce an exactly regulated current in the gradient coil. This current fluctuates in a predetermined curve, for example between 0 and 300 A. Such gradient amplifiers with a switched output stage are well known, for example from German OS 40 24 160. The switched output stage typically has four switch elements connected to form an H-bridge. Respective switch signals are generated for driving each switch element. The switch signal communicates the binary information "switch element on" or "switch element off".

Amplifiers having a number of switched output stages that are connected in series at the output side are also known. Such gradient amplifiers are utilized for modern imaging methods wherein particularly high output voltages are required. German OS 43 04 517 discloses such an amplifier having two or-more output stages. Each output stage has two or four inputs at which switch signals from control units are supplied.

It is also known to employ a signal transmission link with an optical fiber or opto-coupler for the transmission of a switching signal from the control unit to the output stage. This is required in view of the high voltages and currents in the output stage. If there were a direct line connection between the control unit and the output stage, then noise pulses could be transmitted to the sensitive control unit, which is fashioned as a low-amplitude signal component.

There is the problem, however, that a signal transmission link suitable for employment in a gradient amplifier, particularly such a link having a light waveguide, is relatively complicated and expensive. Four such signal transmission links are already required given a gradient amplifier having a single output stage. Twenty transmission links are required for an amplifier having, for example, five output stages, each of which has a respective full bridge. This causes high costs. In the embodiment with opto-couplers, moreover, multi-pole lines having corresponding plugs and sockets are required. Due to the many cables or light waveguides, further, there is a substantial risk of mistake in manufacturing as well as in maintenance.

SUMMARY OF THE INVENTION

An object of the present invention is to provide a power amplifier with a reduced structural outlay compared to known power amplifiers of the type described above, particularly a power amplifier having a number of outlay stages.

The above object is achieved in accordance with the principles of the present invention in a power amplifier of the type initially described, wherein the control unit includes an encoder for encoding the drive data so that the data signal is generated by the control unit according to a serial data transmission protocol.

The invention is based on the idea of allocating the modulator for generating the switching signals for the switch elements of the (at least one) output stage to the output stage itself instead of to the low-amplitude part of the power amplifier. As noted above, the modulator receives suitably encoded drive data in the form of a data signal, and a serial data transmission protocol is utilized for encoding the drive data.

As a result of the inventive approach, the outlay required for the power amplifier is greatly reduced. Only a single data transmission link is generally required for the transmission of the data signal from the control unit to the modulator. Due to the high costs for each data transmission link, this is a considerable improvement compared to known amplifiers wherein a separate data transmission link for the allocated switching signal is provided for each switch element. The assembly and maintenance are also simplified, and errors are avoided.

The advantages of the invention increase as more switched output stages are employed and thus as more switching signals are present which are required for these output stages. The invention is therefore particularly provided for power amplifiers that have more than one switched output stage, however, the invention can also be profitably utilized given an amplifier with only one switched output stage.

The drive data preferably contain information about an operating mode of a switched output stage, or respective operating modes of switched output stages. Such an operating mode can, for example, be a full-load mode or an unbiased mode or a modulating mode. In this latter mode, the drive data preferably also determine the degree of modulation or the pulse duration or the duty cycle of that output stage that is in the modulating mode. When a number of output stages are present, operating modes are preferably respectively defined for each output stage independently of one another.

The switching signal generated by the modulator are preferably binary signals that indicate an "on" and an "off" state for each switch element of the output stage or stages.

The data signal determined according to the serial data transmission protocol is preferably a binary signal having a width of one bit. In this case, one simple data transmission link suffices, however, the data signal may alternatively have a width of a few bits and can assume more than two signal states, as long as the transmission ensues at least partially serially.

The data transmission link is preferably configured for voltage isolated potential-separated and/or optical transmission of the data signal. In particular, a light waveguide can be employed. When the data signal has a width of one bit, a single light waveguide can suffice. A number of data bits to be transmitted are preferably combined to form a data transmission frame in the data transmission protocol. The correct data transmission is preferably checked with one or more parity bits. For example, a parity check can be implemented. In a further embodiment of the invention, error correction bits also can be provided. The individual data bits are preferably encoded with a pulse-width modulation of the data signal. When an error is recognized in the data transmission or an emergency shut off is triggered for some other reason, the modulator is preferably configured to convert the output stage (or stages) into a secure operating condition.

DESCRIPTION OF THE PREFERRED EMBODIMENTS

Figure 1:
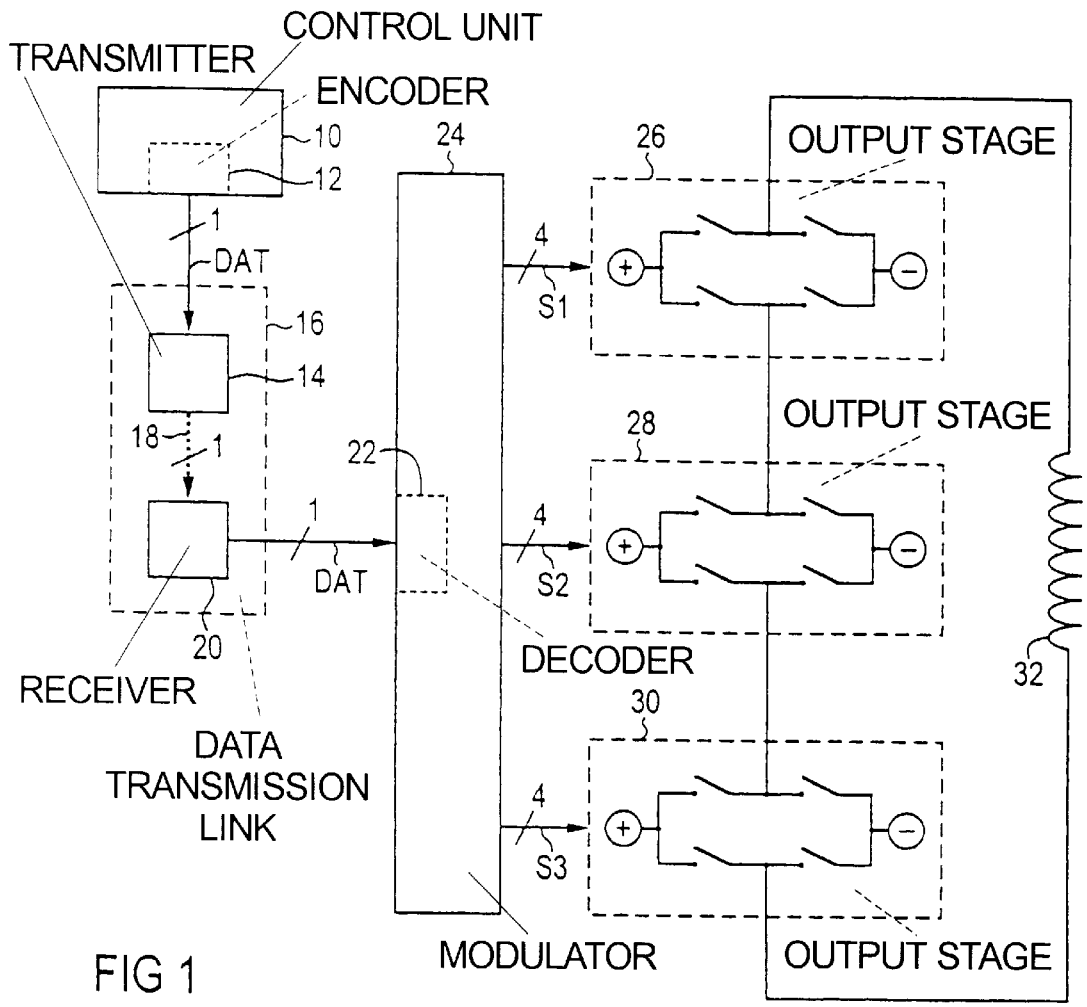
FIG. 1 is a block circuit diagram of an inventive power amplifier connected to a load.

The power amplifier shown in FIG. 1 is fashioned as gradient amplifier of a nuclear magnetic resonance tomography apparatus. The power amplifier has a control unit 10 with an encoder 12. An output of the encoder 12 is connected to a transmitter 14 of an optical data transmission link 16. For example, the transmitter 14 can be formed of a light-emitting diode with a corresponding driver circuit and is connected via a light waveguide 18 to a suitable receiver 20 that is in turn connected to a decoder 22. The receiver 20, for example, can be a phototransistor with a corresponding evaluation circuit. The decoder 22 is a component of a modulator 24. Overall, the data transmission link 14 serves for the galvanically decoupled transmission of a data signal DAT that is one bit wide from the control unit 10 to the modulator 24. In alternative embodiments, the data transmission link can be an opto-coupler or some other galvanic separation means.

In the exemplary embodiment described herein, the power amplifier has three switched output stages 26, 28, 30. In alternative embodiments, more or fewer switched output stages, for example one, four or five, can be provided. Each switched output stage has a full bridge—only schematically shown in FIG. 1—of four switch elements, two thereof being connected in series and being connected to a supply voltage. In the exemplary embodiment described here, the switch elements are fashioned as IGBTs with integrated freewheeling diodes. The output voltage of each switched output stage 26, 28, 30 is tapped at the transverse bridge branch. The switched output stages 26, 28, 30 are connected in series at the output side and are connected to a gradient coil serving as the load 32.

The switched output stage 26 receives four switching signals S1 from the modulator 24 via a respective, voltage isolated connections that, for example, can be formed by an opto coupler. The four switching signals S1 are amplified by suitable drivers and are conducted to the four switch elements of the output stage 26. Each switching signal is capable of switching a switch element either into a conductive or into a blocked condition. Correspondingly, the modulator 24 supplies the switched output stage 28 with four switching signals S2 and supplies the switched output stage 30 with four switching signals S3.

In the circuit shown in FIG. 1, the control unit 10 forms a low amplitude signal part of the power amplifier, whereas the modulator 24 and the output stages 26, 28, 30 form the power part of the amplifier. The control unit 10 in the exemplary embodiment described herein is fashioned as a suitably programmed microprocessor or digital signal processor (DSP), and the encoder 12 is implemented as a module of the control program for this processor. The modulator 24 is a digital circuit. In different versions of the embodiment, the modulator 24 can be fashioned as a single assembly or in the form a plurality of modules. The modulator 24 can include one or more PLDs (PLD=programmable logic device). In particular, each output stage 26, 28, 30 can have a module of the modulator 24 and/or a PLD allocated to it.

During operation of the amplifier shown in FIG. 1, the control unit 10 calculates drive data for the output stages 26, 28, 30. In the exemplary embodiment described herein, the drive data for each output stage 26, 28, 30 indicate an operating mode as well as a degree of modulation or duty cycle. In the alternative embodiments, the drive data contain other information or more or less information.

The basis for the calculation implemented by the control unit 10 is a predetermined shape of the current curve (reference value) of the current flowing through the load 32. In order to achieve this shape of the current curve as exactly as possible, the required output voltage of the power amplifier is determined according to a known regulating method, taking the actual current value into consideration. The control unit 10 then determines suitable drive data, i.e. an operating mode for each output stage 26, 28, 30 and may determine a degree of modulation in order to generate this output voltage.

In the simplest case, the drive data define an identical drive of the output stages 26, 28, 30, so that these contribute identically to the output voltage of the power amplifier at every point in time. In the exemplary embodiment described herein, the control unit 10, however, implements a drive method wherein a single output stage 26, 28, 30 is switched into a modulating mode at every point in time, whereas the other output stages 26, 28, 30 are switched either into a full modulation mode or into an unbiased mode. Such a drive method is disclosed in detail in an application of the present inventor entitled "Method for Generating Control Signals for a Power Amplifier, and Power Amplifier Operating in Accordance with the Method", filed simultaneously herewith (Atty Docket No. P99, 1022) and assigned to the same assignee Siemens AG, as the present application.

The encoder 12 compiles the identified drive data into a serial data signal DAT that is one bit wide, according to the serial data transmission protocol described below.

Figure 2:
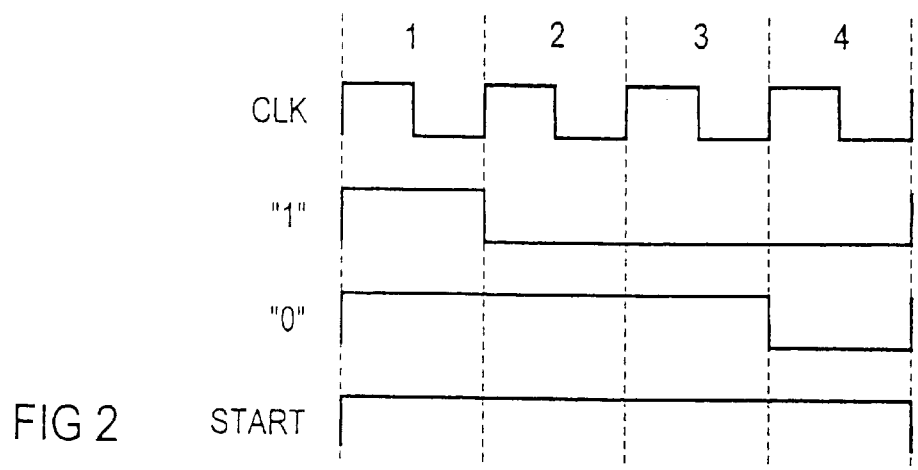
FIG. 2 show time diagrams of a clock signal and a data signal in the transmission of a "1" bit, a "0" bit and a start bit.

In the exemplary embodiment described herein, the serial data transmission protocol provides a bit encoding with a pulse-width modulation, as illustrated in FIG. 1. Four cycles of a system clock CLK of, for example, 32 MHZ are required for the transmission of a data bit, so that a bit clock of 8 MHZ derives overall. A logic "1" is communicated by the data signal DAT assuming a mark status at first that is one clock cycle long and then assuming a space status that is three cycles long (second line in FIG. 2). As shown in the third line of FIG. 2, a logic "0" is transmitted by a mark status that lasts three clock cycles followed by a space status during one clock cycle. In addition to the logic values "1" and "0", the data transmission protocol provides a start value START that is represented by a mark status that is four clock cycles long (fourth line in FIG. 2). Since the leading edges given the three transmittable bit values "1", "0" and "START" coincide with the edges of the signal clock CLK and periodically repeat, the system clock CLK can be recovered in a simple way in the receiver 20.

In the exemplary embodiment described herein, the drive data to be transmitted combined according to the data transmission protocol to form data transmission frames of 36 bits each. Given the aforementioned bit clock of 8 MHZ, the communication of a complete data transmission frame lasts about 4.5 μs. Each data transmission frame begins with a start bit "START". The further data of this frame are successively transmitted without further start bits. An exemplary occupation of the individual bit positions in the data transmission frame is shown by the following table. Other occupations are provided in alternative embodiments:

| Pos. | Occupation |
|------|------------|
| 1 | Startbit |
| 2 | Header (LSB) |
| 3 | Header |
| 4 | Header (MSB) |
| 5 | Shutdownbit |
| 6 | Positive Current |
| 7 | Positive Current |
| 8 | Voltage OP. Sign |
| 9 | Pulse duration |
| 10 | Pulse Duration |
| 11 | Pulse Duration |
| 12 | Pulse Duration |
| 13 | Pulse Duration |
| 14 | Pulse Duration |
| 15 | Pulse Duration |
| 16 | Pulse Duration |
| 17 | Pulse Duration |
| 18 | Pulse Duration |
| 19 | Pulse Duration |
| 20 | Pulse Duration |
| 21 | Mode |
| 22 | Mode |
| 23 | Mode |
| 24 | Mode |
| 25 | Mode |
| 26 | Mode |
| 27 | Mode |
| 28 | Mode |
| 29 | Mode |
| 30 | Mode |
| 31 | Mode |
| 32 | Mode |
| 33 | Mode |
| 34 | Mode |
| 35 | Mode |
| 36 | Parity Bit |

The Startbit, which occupies the first bit position in the data transmission frame, is followed by three header bits. These bits enable an identification of eight different formats of the data transmission frame. In the exemplary embodiment described herein, only the format shown above is used. In modified embodiments, by contrast, different formats are provided in order to transmit more and/or other data. For example, these can be pulse-duration and/or operating mode data for further output stages or data for configuration or maintenance purposes. Given an output stage switching clock of 100 kHz provided here, an updating of the drive data in a time grid of 10 μs is meaningful in order to achieve a maximum system dynamics. Since the transmission of a data frame only lasts 4.5 μs, a further data packet can be unproblematically inserted between two of the respective data transmission frames shown above.

A shutdown bit is located at the fifth bit position. This bit is set in order to already trigger an emergency output stage shutoff at the beginning of the transmission frame given malfunction.

The bits at the sixth and seventh position indicate the current direction of the output current. As a result, the switching signals for those switch elements of the output stages 26, 28, 30 at which the flow of current ensues at the moment through the allocated freewheeling diode can be suppressed. The eighth bit of the data frame determines the operational sign (polarity) of the output voltage.

As a 12-place binary number, bits 9 through 20 contain a value that indicates the degree of modulation of a modulating output stage, i.e. the duty cycle thereof. As in the case of the other values of the data transmission frame, the transmission ensues in the sequence from the least significant bit to the most significant bit (LSB=least significant bit; MSB=most significant bit). An unambiguous allocation of the transmitted value to the modulating switched output stage is possible in the exemplary embodiment described here because only one respective switched output stage is in a modulating operating condition at any point in time. This allocation ensues in a different way in alternative embodiments.

The bits at positions 21 through 23 determine the operating mode of the switched output stage 26. One of a total of eight operating modes can be selected. For example, a modulating operating mode, an unbiased operating mode (the switched output stage 26 carries the current in the load circuit given an output stage output voltage of zero), a positive and negative fully modulated operating mode and an operating mode wherein all switch elements of the switched output stage 26 are opened are provided.

Correspondingly, three successive bits for respectively determining the operating modes of a maximum of four further switched output stages are provided at positions 24 through 35. In the exemplary embodiment described herein, only the two switched output stages 28 and 30 are also present; the data transmission frame, however, is provided for power amplifiers having up to five switched output stages.

The data transmission frame is terminated (bit position 36) by a parity bit for error recognition. This parity bit is set such by the encoder 12 that the number of "1" bits in every data frame is always even or is always odd. A parity infringement is interpreted by the decoder 22 as an error condition and triggers an emergency shutoff of the power amplifier.

The drive data combined by the encoder 12 according to the above-described protocol to form the data signal DAT are communicated to the decoder 22 via the data transmission link 16. The decoder 22 regenerates the transmitted drive data from the data signal DAT. These are converted in the modulator 24, according to a known modulation method, into the switching signals S1, S2, S3 for the switched output stages 26, 28, 30. The switching signals S1, S2, S3 are pulse-width modulated signals. The disclosure of German OS 40 24 160 is an example of a suitable drive method, this disclosure being incorporated herein by reference. Given the method disclosed therein, two respective switch elements lying diagonally opposite one another in the bridge circuit are periodically clocked in each direction of the load current. The degree of modulation is determined by the overlap of the on times of these switch elements. In addition, two switches connected in series in the bridge circuit are clocked in anti-phase. Other modulation methods are used in alternative embodiments.

In addition to this normal operating mode, the modulator 24 triggers an emergency shutoff when either the shutdown bit (position 5 in the data transmission frame) is set or parity errors were recognized. In this case, the load current is reduced to zero with a predetermined rate of current change. All output stages 26, 28, 30 are then shut off.

Although modifications and changes may be suggested by those skilled in the art, it is the intention of the inventor to embody within the patent warranted hereon all changes and modifications as reasonably and properly come within the scope of his contribution to the art.

I claim as my invention:

1. A power amplifier comprising:

a switched output stage;

a control unit which generates drive data for said switched output stage, said control unit including an encoder supplied with said drive data which encodes said drive data according to a serial data transmission protocol, to generate a data signal embodying the encoded drive data;

a data transmission link for voltage isolated transmission of said data signal, including at least portions for optically transmitting the data signal; and a modulator connected to said data transmission link for receiving the data signal and for generating switching signals for operating said switched output stage dependent on said drive data.

2. A power amplifier as claimed in claim 1 wherein said control unit generates said drive data to define an operating mode for said switched output stage.

3. A power amplifier as claimed in claim 1 wherein said control unit generates said drive data to define a degree of modulation of said switched output stage.

4. A power amplifier as claimed in claim 1 wherein said control unit generates said drive data to define an operating mode and a degree of modulation of said switched output stage.

5. A power amplifier as claimed in claim 1 wherein said switched output stage comprises a plurality of switching elements, and wherein said switching signal respectively drive said switch elements.

6. A power amplifier as claimed in claim 1 wherein said encoder combines a plurality of data bits to form said data signal in a data transmission frame.

7. A power amplifier comprising:

a switched output stage;

a control unit which generates drive data for said switched output stage, said control unit including an encoder supplied with said drive data which encodes said drive data according to a serial data transmission protocol, to generate a data signal embodying the encoded drive data said data signal including data identifying a need for an emergency shutoff;

a data transmission link for transmitting the data signal; and a modulator connected to said data transmission link for receiving the data signal and for generating switching signals for operating said switched output stage dependent on said drive data said modulator being responsive to said data identifying a need for an emergency shutoff to switch said output stage into a secure operating state.

8. A method for driving a power amplifier having at least one switched output stage, comprising the steps of:

determining drive data for said output stage including drive data for setting an operating mode and a degree of modulation of said switched output stage;

transmitting said drive data to a modulator using a serial data transmission protocol including transmitting a plurality of data bits, combined to form a data transmission frame, said data transmission frame includes at least one data bit identifying said operating mode and at least one data bit identifying said degree of modulation; and generating switching signals at said modulator for operating said switched output stage using the drive data transmitted according to said serial data transmission protocol.

9. A method as claimed in claim 8 wherein the step of determining drive data comprises determining drive data setting an operating mode of said output stage.

10. A method as claimed in claim 8 wherein the step of determining drive data comprises determining drive data for setting a degree of modulation of said switched output stage.

11. A method as claimed in claim 8 wherein the step of determining drive data comprises determining drive data for setting an operating mode and a degree of modulation of said switched output stage.

12. A method as claimed in claim 8 comprising the additional step of including at least one bit in said data transmission frame for allowing correct transmission of said plurality of bits in said transmission frame to be checked.

* * * * *